(12) United States Patent
Koike

(10) Patent No.: US 6,677,623 B2
(45) Date of Patent: Jan. 13, 2004

(54) BED STRUCTURE UNDERLYING ELECTRODE PAD OF SEMICONDUCTOR DEVICE AND METHOD FOR MANUFACTURING SAME

(75) Inventor: Noboru Koike, Ota-ku (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 10/217,455

(22) Filed: Aug. 14, 2002

(65) Prior Publication Data

US 2002/0190394 A1 Dec. 19, 2002

Related U.S. Application Data

(60) Continuation of application No. 09/907,659, filed on Jul. 19, 2001, now Pat. No. 6,465,894, which is a continuation of application No. 09/414,632, filed on Oct. 8, 1999, now Pat. No. 6,294,454, which is a division of application No. 08/863,423, filed on May 27, 1997, now Pat. No. 6,049,135.

(30) Foreign Application Priority Data

May 28, 1996 (JP) .............................................. 8-133028

(51) Int. Cl.⁷ .............................................. H01L 29/74
(52) U.S. Cl. ....................................... 257/170; 257/169
(58) Field of Search ................................ 257/169, 170; 438/617, 612

(56) References Cited

U.S. PATENT DOCUMENTS

| 4,509,249 A | * | 4/1985 | Goto et al. .................... 29/576 |
| 4,713,157 A | * | 12/1987 | McMillan et al. ..... 204/192.11 |
| 4,869,781 A | | 9/1989 | Euen et al. |
| 5,309,025 A | | 5/1994 | Bryant |
| 5,703,408 A | | 12/1997 | Ming-Tsung et al. |
| 6,143,638 A | | 11/2000 | Bohr |
| 6,291,274 B1 | * | 9/2001 | Oida et al. .................... 438/123 |

FOREIGN PATENT DOCUMENTS

| JP | 59-58832 | 4/1984 |
| JP | 5-275527 | 10/1993 |
| JP | 8-288380 | 11/1996 |

* cited by examiner

*Primary Examiner*—David Nelms
*Assistant Examiner*—Thao P Le
(74) *Attorney, Agent, or Firm*—Finnegan, Henderson, Farabow, Garrett & Dunner, L.L.P.

(57) ABSTRACT

A semiconductor device has: a semiconductor substrate having a surface which has a predetermined pattern, in which an insulating layer is embedded; an interlayer insulator film formed on the substrate, the interlayer insulator film having a protective coat for protecting the substrate; and an electrode formed on the interlayer insulator film. In addition, a method for manufacturing a semiconductor device comprises the steps of: forming a semiconductor substrate having a surface which has a groove in which an insulating layer is embedded; forming a protective coat for protecting the surface of the semiconductor substrate, on the upper surface of the insulating layer embedded in the groove; and forming an electrode on the protective coat. According to the semiconductor device and the method for manufacturing the same, it is possible to more sufficiently planarize the surface of the insulating layer by the rotary polishing method, and it is possible to decrease the bonding damage applied to a underlayer portion serving as a bed of the semiconductor device when carrying out the wire bonding.

14 Claims, 16 Drawing Sheets

BED STRUCTURE UNDERLYING ELECTRODE PAD OF SEMICONDUCTOR DEVICE AND METHOD FOR MANUFACTURING SAME

This is a continuation of application Ser. No. 09/907,659, filed Jul. 19, 2001, now U.S. Pat. No. 6,465,894 which is a continuation application of Ser. No. 09/414,632, filed Oct. 8, 1999 (now U.S. Pat. No. 6,294,454), which is a divisional application of Ser. No. 08/863,423, filed May 27, 1997 (now U.S. Pat. No. 6,049,135), all of which are incorporated herein by reference.

BACKGROUND OF THE INVENTION

The present invention relates generally to a bed structure underlying an electrode pad of a semiconductor device and a method for manufacturing the same. More specifically, the invention relates to a bed structure underlying an electrode pad of a semiconductor device, which is manufactured using the element isolation technique, and a method for manufacturing the same.

Referring to FIGS. 1 through 8, a semiconductor device having a bed structure underlying a pad electrode, which is formed by embedding an insulation layer in a groove to isolate the adjacent elements from each other, will be described below.

FIG. 1 shows a semiconductor substrate 1 on which active regions 2 are formed by a usual lithography and etching technique. As will be described later, semiconductor devices or the like are formed on the active regions 2. FIG. 2 is a plan view of the semiconductor substrate 1 of FIG. 1.

FIG. 3 is a cross sectional view taken along line A–B of FIG. 2. In FIG. 3, insulator films 3 are embedded in regions other than the active regions 2 (which will be hereinafter referred to as "field regions"). The insulator films 3 serve as element isolating insulator films for isolating the adjacent active regions 2 from each other.

In FIG. 3, after semiconductor devices (not shown) are formed on the respective active regions 2, the element isolating insulator films 3 are formed in grooves around the active regions 2. In this state, an interlayer insulation layer 4 is deposited as shown in FIG. 4. Then, a pad electrode 5 is formed on the interlayer insulation layer 4, and a passivation film 6 is formed thereon. As the above manner, an underlayer structure underlying the pad electrode 5 is formed. Here, FIG. 4 only shows the structure on the element isolation insulator film 3.

Then, steps of embedding the element isolation insulator film 3 of, e.g., silicon dioxide, in a predetermined portion formed as a field region, will be described below.

FIG. 5 is a view illustrating a cross section of a region between points E and F of FIG. 2. First, as shown in FIG. 5, a groove 1a formed in the semiconductor substrate 1 is filled with silicon dioxide or the like. Thereafter, as shown in FIG. 6, the element isolating insulator film 3 is also deposited thereon. The element isolating insulator film 3 is deposited on the whole surface of the semiconductor substrate 1 by the CVD method. Here, if the width W of the groove is large, a recessed portion 11 is formed on the deposited insulator film 3. The substrate 1 is polished while rotating a polishing member 10 by, e.g., the rotary polishing method. Then, the portion of the insulator film 3 deposited on the upper surface of the substrate 1 is removed, so that the insulator film 3 can be embedded in the region between points E and F.

In addition, if the recessed portion 11 remains in a part of the upper surface of the deposited insulator film 3 in the polishing step, the insulator film 3 can not be evenly polished due to the remaining recessed portion 11, so that a recessed portion 12 may remain the upper surface of the element isolating insulator film 3. As a result, it may be difficult to form a pad electrode on the upper surface of the recessed portion 12 in subsequent steps.

Referring to FIG. 8, a step of bonding a wire to a pad, which is an example of a bonding step, will be described below.

First, a capillary 7 having a nib shape is pressed against the pad electrode 5 at a predetermined angle, so that a wire 8 is bonded to the pad electrode 5. At this time, the physical impact applied to the pad electrode 5 damages the interlayer insulator film 4, the element isolating insulator film 3 and the semiconductor substrate 1, which are arranged below the pad electrode 5. In order to prevent such damage, the pad electrode 5 is usually formed on the upperlayer overlying a region, wherein no semiconductor device is formed, i.e., a field region. Therefore, the place for forming the pad electrode 5 is restricted.

As mentioned above, in conventional semiconductor devices, the pad electrode is formed on the layer above the field region in view of the damage applied to the pad electrode in the bonding step. Therefore, there is a problem in that the pad electrode 5 is necessary formed on an upperlayer of the field region in which a semiconductor element is not formed, so that the pad electrode forming place is limited thereto.

In addition, since it is required to surely electrically isolate the field region from the active region adjacent thereto, the area occupied by the field region is considerably greater than the area occupied by the active region. For that reason, as shown in FIG. 7, there is a problem in that the insulator film embedded in the element isolating insulator film has a recessed portion.

In order to eliminate such problems, there is provided a method for forming a film, such as a carbon film or a silicon nitride film, which is difficult to be polished, particularly on the recessed portion 11 of the interlayer insulator film 3 of FIG. 6 so as not to form the recessed portion 12 of FIG. 7 when polishing. However, according to such a method for forming a film which is difficult to be polished, the number of steps is increased by the step of forming the carbon film or the silicon nitride film, so that there is a problem in that the manufacturing of a semiconductor device is complicated.

SUMMARY OF THE INVENTION

It is therefore an object of the present invention to eliminate the aforementioned problems and to provide a semiconductor device and a method for manufacturing the same, wherein the surface of an insulating layer can be more planarized by the rotary polishing method and wherein the bonding damage to the underlayer portion serving as a bed of a semiconductor can be prevented in a bonding step.

In order to accomplish the aforementioned and other objects, according to one aspect of the present invention, there is provided a semiconductor device which comprises: a semiconductor substrate having a surface which has a predetermined pattern, in which an insulating layer is embedded; an interlayer insulator film formed on the substrate, the interlayer insulator film having a protective coat for protecting the substrate; and an electrode formed on the interlayer insulator film.

According to another aspect of the present invention, there is provided a method for manufacturing a semiconductor device, which comprises the steps of: forming a semiconductor substrate having a surface which has a groove in which an insulating layer is embedded; forming a protective coat for protecting the surface of the semiconductor substrate, on the upper surface of the insulating layer embedded in the groove; and forming an electrode on the protective coat.

With this construction, according to the present invention, it is possible to more sufficiently planarize the surface of the insulating layer by the rotary polishing method. In addition, it is possible to decrease the bonding damage applied to a underlayer portion of the semiconductor device, at which a pad electrode is formed when carrying out the wire bonding. Moreover, it is possible to manufacture a semiconductor having a strength sufficiently resistant to the bonding damage, without increasing the number of the manufacturing steps.

DESCRIPTION OF THE PREFERRED EMBODIMENTS

Referring now to the accompanying drawings, particularly to FIGS. 9 through 20, the preferred embodiments of a semiconductor device and a method for manufacturing the same, according to the present invention, will be described below.

First, referring to FIGS. 9 through 13, the first preferred embodiment of a method for manufacturing a semiconductor device, according to the present invention, will be described.

Figure 9:
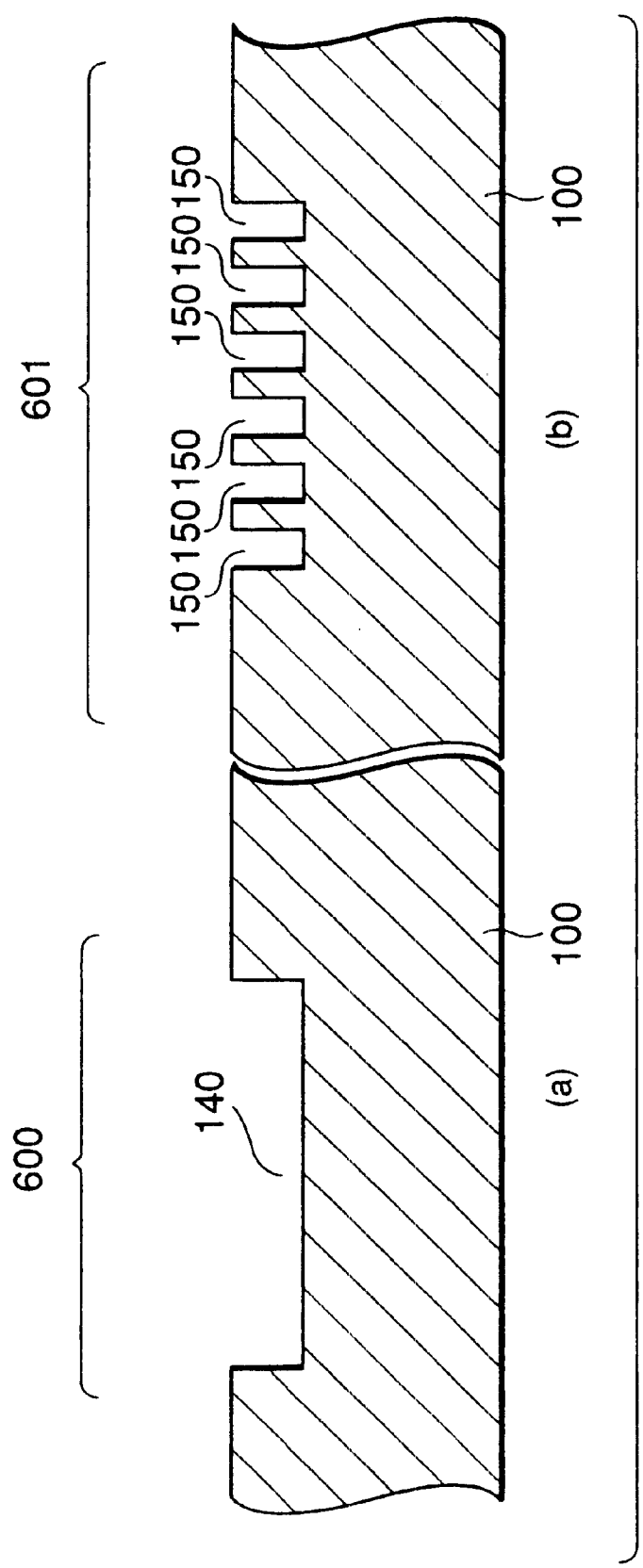
FIG. 9 is a cross sectional view explaining the steps of manufacturing the first preferred embodiment of a semiconductor device according to the present invention.

FIG. 9 is a cross sectional view illustrating (a) a region 600 to be formed as an element isolating region, and (b) a region 601 serving as a bed portion of a pad electrode. In FIG. 9, a groove 140 (which will be hereinafter referred to as a "STI—shallow trench isolation—groove" for isolating the adjacent elements from each other and a plurality of grooves 150 having a width narrower than that of the STI groove 140 are simultaneously formed in the element isolating region 600 and the region 601 serving as the bed portion of the pad electrode, respectively, by a usual lithography and etching method. In conventional semiconductor devices, the STI groove 140 having a wide width is also formed in the region 601 similar to the element isolating region 600. According to the present invention, in order to prevent the recessed portion 12 from being formed in the polishing step, a plurality of grooves 150 each having a width narrower than that of the STI groove 140 are formed to prevent the recessed portion 11 from being formed due to the sink mark of the insulator film stacked in the insulator film forming step prior to the polishing step.

The first preferred embodiment of the present invention is characterized in that a plurality of recessed portions remain in the STI groove of the substrate, on which the electrode pad is formed by the longitudinal and lateral grooves when the manufacturing of the semiconductor device is completed, as shown in FIG. 9.

Figure 10:
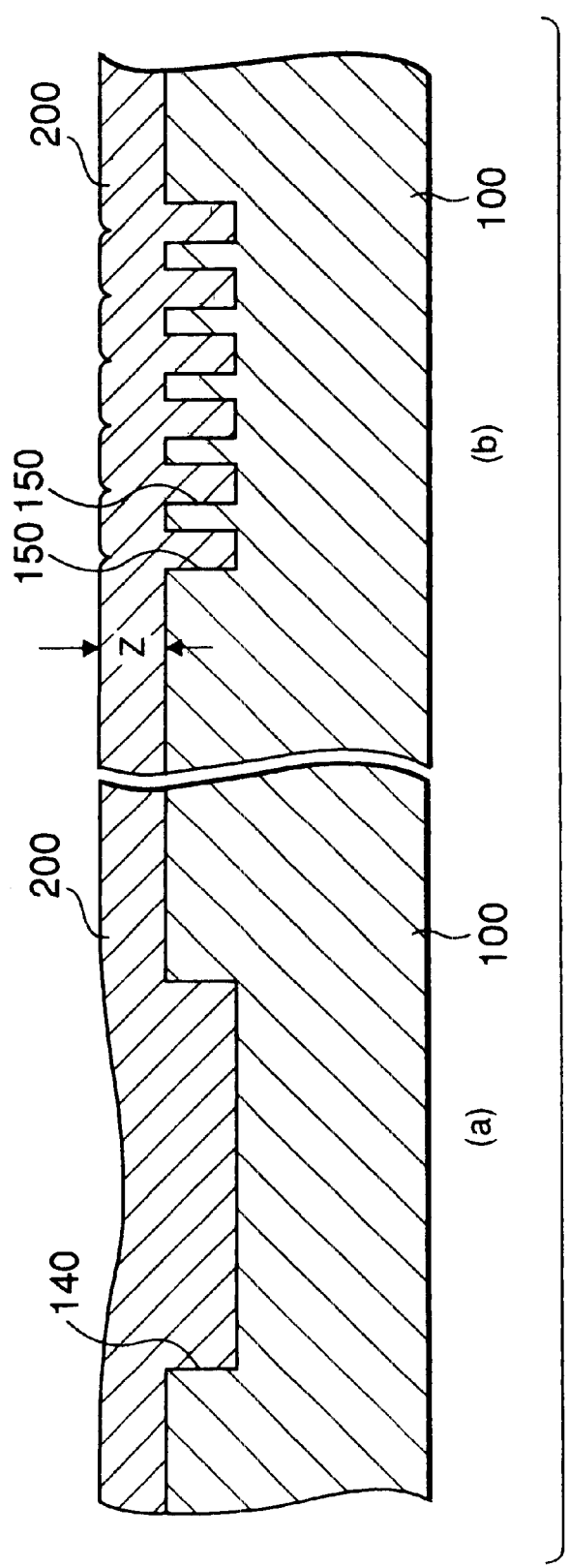
FIG. 10 a cross sectional view explaining the steps of manufacturing the first preferred embodiment of a semiconductor device according to the present invention.

Then as shown in FIG. 10, an insulator film 200 of, e.g., silicon dioxide ($SiO_2$), is formed on the upper surface of a semiconductor substrate 100 using the chemical vapor deposition (CVD). The insulator film 200 is stacked so as to have a thickness sufficient to completely fill in the STI groove 140 and the plurality of grooves 150. In FIG. 10, on the upper sides of the STI groove 140 for insulating the adjacent layers from each other and the plurality of grooves 150 formed in the field region, the recessed portions or sink marks corresponding to the shapes of the grooves 140 and 150 remain on the surface of the insulator film 200. These recessed portions or sink marks are polished to be removed in subsequent steps. In this case, the insulator films 200 is stacked on the upper surface of the active region of the semiconductor device 100 so as to have a thickness Z, by which the traces of the recessed portions or sink marks do not remain after being sufficiently polished.

Figure 11:
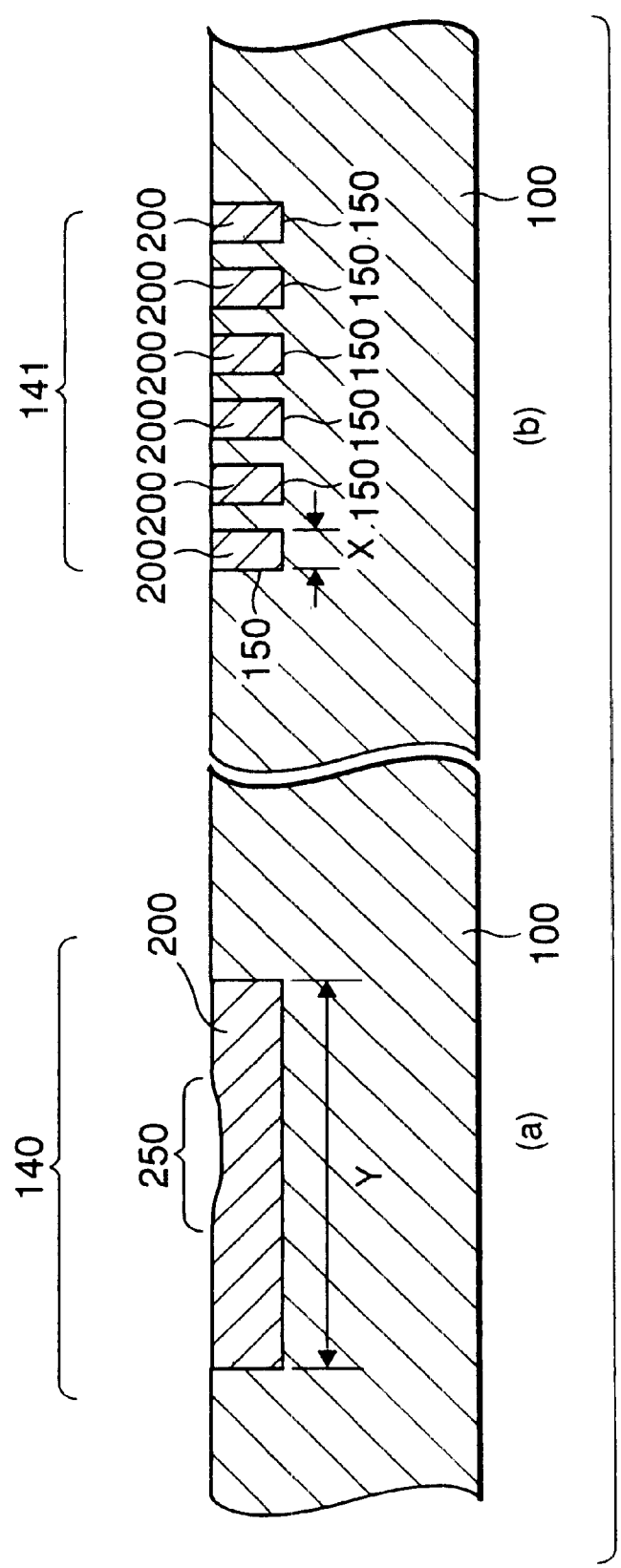
FIG. 11 a cross sectional view explaining the steps of manufacturing the first preferred embodiment of a semiconductor device according to the present invention.

Then, as shown in FIG. 11, if the insulator film 200 is polished by the rotary polishing method, all the insulator films 200 are removed from the upper surface of the semiconductor substrate 100, and the insulator films 200 are simultaneously formed only in the grooves 140 and 150. A recessed portion 250 is formed in the surface of the insulator film 200 filling in the STI groove 140 since the length Y of the groove 140 is long. However, no recessed portion is formed in the insulator films 200 filling in the plurality of grooves 150 since the length X of the groove 150 is short, so that it is possible to planarize the surface thereof. Thus, the STI is formed.

As mentioned above, it is possible to simultaneously form an element isolation region (140) and a bed region (141) on which a pad electrode will be formed. With respect to the bed portion underlying the pad electrode shown in FIG. 11(b), a wire is bonded to the electrode after forming the pad electrode. This step will be described below.

Figure 12:
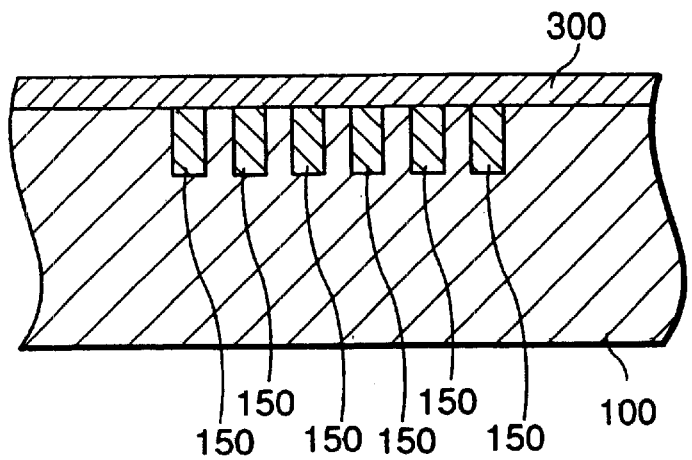
FIG. 12 a cross sectional view explaining the steps of manufacturing the first preferred embodiment of a semiconductor device according to the present invention.

First, as shown in FIG. 12, a protective coat 300 is formed on the upper surface of the semiconductor substrate 100 in which the dummy pattern has been formed. This protective coat 300 is made of, e.g., silicon nitride film having a thickness of about 50 to about 500 nm, which is formed by the CVD method. The protective coat 300 serves to protect the surface of the substrate 100 from the impact applied to the semiconductor substrate 100 when bonding the wire to the pad electrode.

The step of forming the protective coat 300 is not an additional step, so that the protective coat 300 may be simultaneously formed when manufacturing a polycrystalline silicon, a high-melting point metal and a silicon nitride film, which serve as a gate electrode. That is, if the gate electrode is formed by the polycrystalline silicon and a high-melting point metal to deposit the silicon nitride film on the gate electrode after polishing the insulating layer 200, it is possible to simultaneously form the gate electrode and the protective coat in one step.

Figure 13:
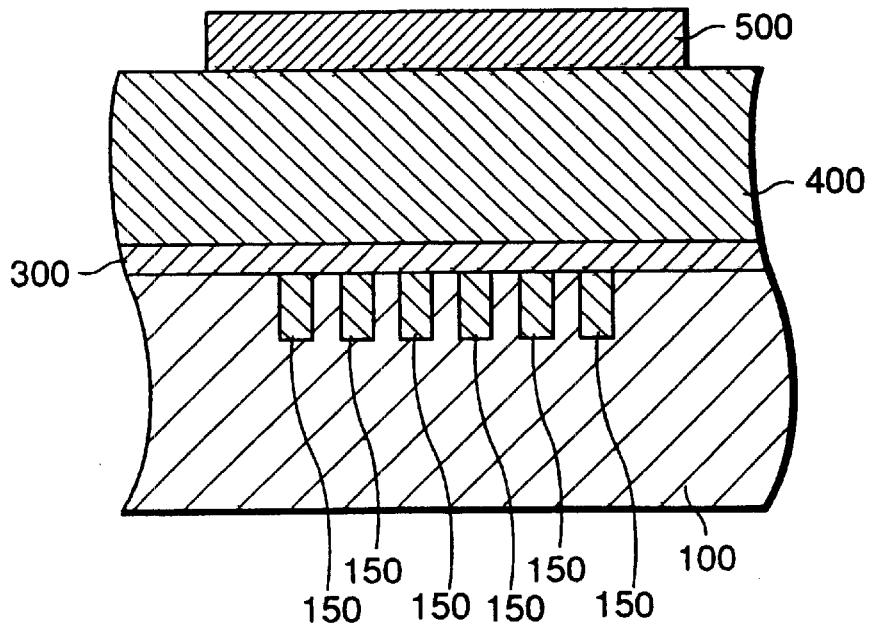
FIG. 13 a cross sectional view explaining the steps of manufacturing the first preferred embodiment of a semiconductor device according to the present invention.

Then, as shown in FIG. 13, an interlayer insulator film 400 of, e.g., silicon dioxide ($SiO_2$), is formed on the protective coat 300. On the interlayer insulator film 400, a pad electrode 500 is formed. The pad electrode 500 is arranged above the grooves 150 in which the insulator films 200 are embedded. Thereafter, in order to electrically connect the pad electrode 500 to an external circuit (not shown), the wire bonding is carried out. Since the wire bonding step is the same as the conventional step described referring to FIG. 8, the description thereof is omitted. After the bonding step is completed, subsequent treatments, such as sizing into a predetermined shape, are carried out to complete the manufacturing of a semiconductor device such as a random access memory (RAM).

The first preferred embodiment of a semiconductor device manufactured by the aforementioned steps, according to the present invention, comprises: the insulator films 200 embedded in the plurality grooves 150; and the protective coat 300 for covering the upper surface thereof. Therefore, it is possible to decrease the bonding damage applied to the underlayers from top in the bonding step, so that it is possible to prevent the semiconductor substrate 100 from cracking or the like due to the bonding damage.

Figure 14:
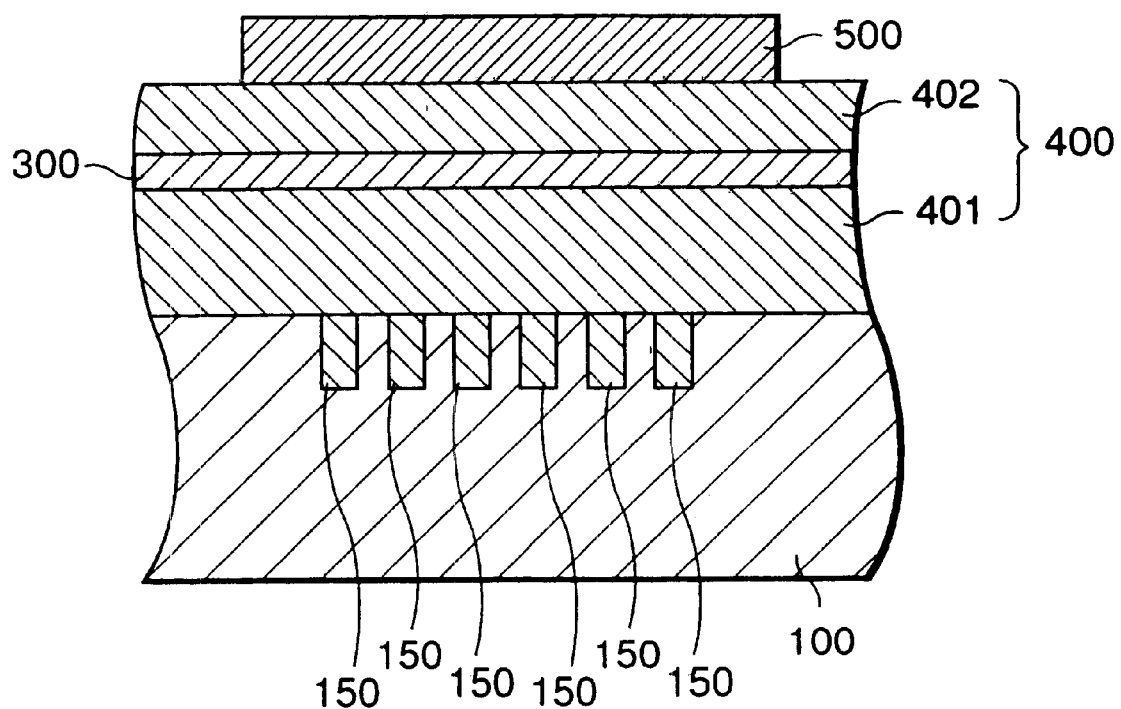
FIG. 14 is a cross sectional view of the second preferred embodiment of a semiconductor device according to the present invention.

Furthermore, in the aforementioned first preferred embodiment of a semiconductor device and a method for manufacturing the same according to the present invention, while the protective coat 300 for protecting the semiconductor device 100 from the bonding damage when carrying out the wire bonding has been formed between the interlayer insulator 400 and the insulator films 200 embedded between layers and in the groove 150, the present invention should not be limited thereto, but it may be provided at another location as shown in FIG. 14 which illustrates the second preferred embodiment of a semiconductor device and a method for manufacturing the same according to the present invention.

FIG. 14 shows the second preferred embodiment of a semiconductor device, according to the present invention, wherein element isolating insulator films 200 and insulator films are simultaneously embedded in dummy pattern grooves 150 formed in a semiconductor substrate 100, and interlayer insulator films 400 are formed thereon. The interlayer insulator film 400 comprise two layers. Specifically, a protective coat 300 of, e.g., silicon nitride film, is formed on a first interlayer insulator film 401 of, e.g., silicon dioxide ($SiO_2$), and then, a second interlayer insulator film 402 of, e.g., silicon dioxide ($SiO_2$), is formed thereon. Therefore, the protective film 300 is provided in the intermediate layer of the interlayer insulator film 400.

Since the silicon nitride film has a high impact resistance, it is possible to protect the semiconductor substrate from bonding damage only if the silicon nitride film is formed on the semiconductor substrate as the first preferred embodiment. In a case where the protective coat 300 is formed in the intermediate layer of the interlayer insulator film 400 as the second preferred embodiment, even if cracks or the like occur due to bonding damage, only the protective coat 300 and the second interlayer insulator film 402 formed thereon may be damaged, so that it is possible to prevent the first interlayer insulator film 401 from being damaged. Therefore, it is possible to more surely prevent electrical currents from flowing through the semiconductor substrate 100.

Furthermore, in the first and second preferred embodiments of a semiconductor device and a method for manufacturing the same according to the present invention, while the plurality of thin grooves 150 serving as dummy pattern have been formed in the semiconductor substrate 1, the present invention should not be limited thereto, but a wiring layer may be substituted for the thin grooves in the case of a multi-layer wiring structure.

In addition, since the plurality grooves serving as the dummy pattern underlying the pad electrode are formed at the same time that the groove 140 for the element isolating insulator film is formed, there is no disadvantage in that the number of manufacturing steps increases in comparison with the conventional method for forming the film, which is difficult to be polished, in the recessed portion. In addition, the active region serving as the aforementioned element region is often provided with a semiconductor device having a lightly doped drain (LDD) structure wherein a drain region is made of low-density and high-density semiconductors and a side wall serving as an offset region is provided therebetween. Since this side wall is usually made of silicon nitride film, it is possible to simultaneously form the side wall of the LDD structure and the protective coat 300 in one step in the case of the protective coat 300 of silicon nitride film. Therefore, it is possible to manufacture a semiconductor device, which is highly resistant to bonding damage, without increasing the number of manufacturing steps.

In addition, as shown in FIG. 11, it is effective that the width X of the groove 150 formed in the surface of the semiconductor substrate 100 is less than the width Y of the STI groove 140, and it is desired that the width of the groove 150 and the number of the grooves 150 to be formed are determined on the basis of the width of the pad electrode and the height Z (see FIG. 10) of the stacked insulator film 200. Therefore, the dummy pattern may have any shapes and designs if the width X of the groove 150 is sufficiently narrow.

Referring to FIG. 15 through 20, the third through seventh preferred embodiments of a semiconductor device and a method for manufacturing the same, according to the present invention, will be described below.

Figure 15:
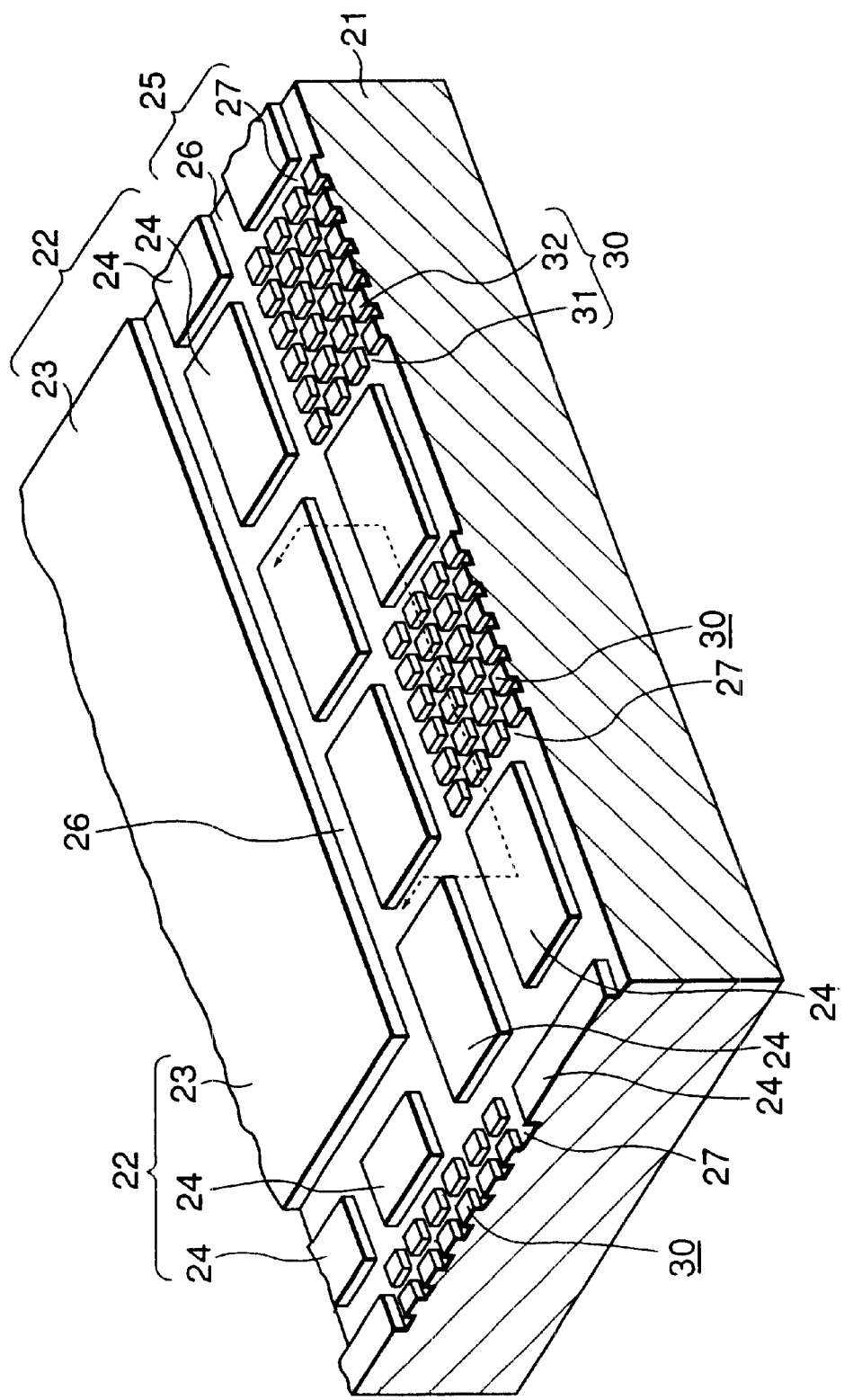
FIG. 15 is a perspective view schematically illustrating the third preferred embodiment of a semiconductor device according to the present invention.

FIG. 15 is a partially perspective view conceptually illustrating the structure of the third preferred embodiment of a semiconductor device according to the present invention. This preferred embodiment of a semiconductor device will be described using a static RAM (SRAM) serving as a memory element of a computer or the like, as an example. In FIG. 15, a semiconductor device 20 comprises a semiconductor substrate 21, an element region 22 for various semiconductor elements formed on the surface of the semiconductor substrate 21 by photo-etching the surface of the semiconductor substrate 21, and a shallow trench isolation (STI) region 25 other than the element region 22.

In the case of the third preferred embodiment, the element region 22 includes: a memory cell region 23 serving as a memory for storing information when the manufacturing of the semiconductor device serving as a SRAM is completed; and an active region 24 in which various circuits for writing and reading information in and out of the memory cell region 23. The STI region 25 comprises an element isolating groove 26 for isolating the adjacent element regions 22 from each other, and a bed region 27 on which a pad electrode is stacked when the manufacture of the SRAM is completed. The bad region 27 is formed with a dummy pattern 30 for protecting the semiconductor substrate from bonding damage. In the third preferred embodiment, the dummy pattern is a simple pattern in order to save troubles when carrying out the photo-etching. Specifically, the dummy pattern includes a plurality of fine grooves 31 extending in longitudinal and lateral directions, and a plurality of projecting portions 32 formed by the grooves 31 so as to form a lattice-shaped pattern.

Figure 16A:
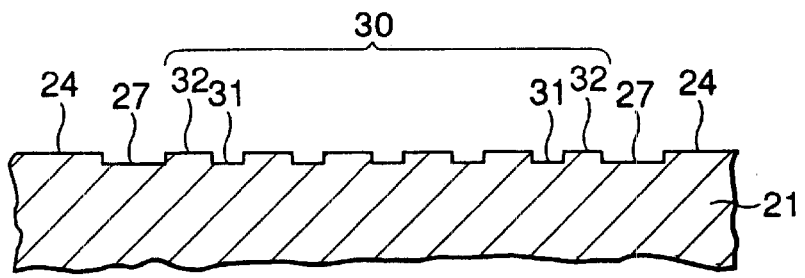
FIGS. 16A through 16E are cross sectional views explaining the steps of manufacturing the third preferred embodiment of a semiconductor device according to the present invention.

With respect to the semiconductor substrate 21 on which the pattern shown in FIG. 15 is formed, the manufacturing steps shown in FIGS. 16A through 16E are carried out to complete the manufacturing of a semiconductor device. FIG. 16A is a cross sectional view of the semiconductor substrate 21, which is taken along a dashed line of FIG. 15. FIG. 16A shows a step of forming a circuit pattern containing the dummy pattern 30 by the lithography or etching method.

Figure 16B:
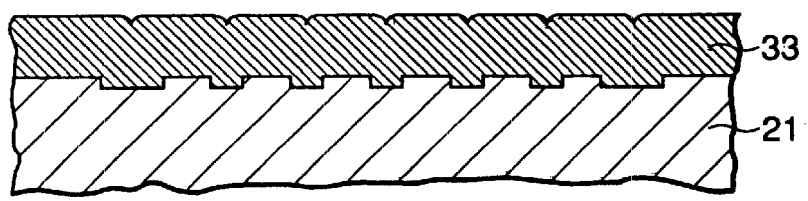

Then, as shown in FIG. 16B, an insulator film 33 of, e.g., silicon dioxide ($SiO_2$), is deposited on the semiconductor substrate 21 by the CVD method. At this time, the plurality of fine grooves 31 of the dummy pattern 30 and the bed regions 27 surrounding the dummy pattern 30 are sufficiently filled with silicon dioxide so as to be completely buried. The element isolating grooves 26 shown in FIG. 15 are also filled with silicon dioxide so as to be completely buried. This state is not shown.

Figure 16C:
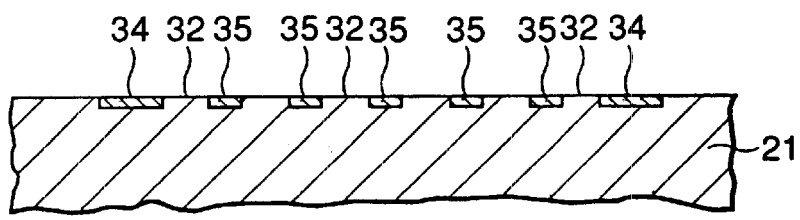
Figure 16D:
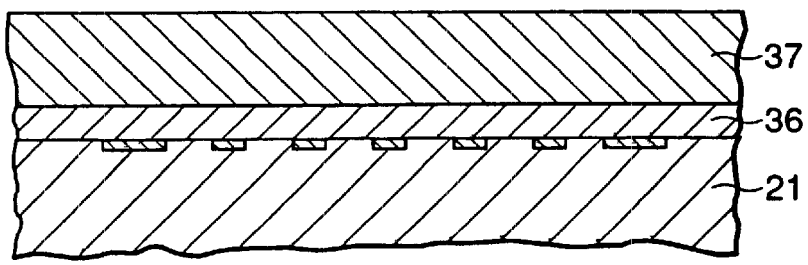

Then, as shown in FIG. 16C, the insulator film 33 is polished by the rotary polishing method until the surface of the semiconductor substrate 21 is exposed, so that insulating layers 34 and 35 are formed. Therefore, the lattice-shaped pattern 32 of the dummy pattern 30 having the same level as that of the surface of the semiconductor substrate 21 also exists in the bed region at which a pad electrode is formed in subsequent steps.

Figure 16E:
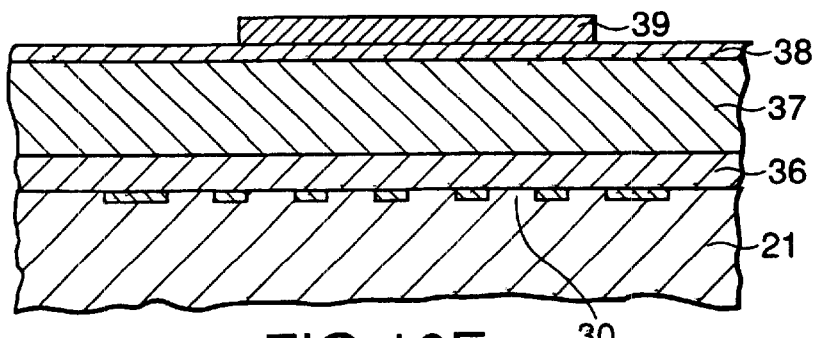

FIGS. 14D and 16E schematically illustrate subsequent steps. On the semiconductor substrate 21 on which the insulating layers 34 are formed as shown in FIG. 16C, a protective coat 36 is formed. An interlayer insulator film 37 is formed on the protective coat 36 by stacking thereon, e.g., silicon dioxide. Thereafter, as shown in FIG. 16E, the patterning of a wiring layer 38 on the interlayer insulator film 37 is carried out to form a pad electrode 39.

Figure 1:
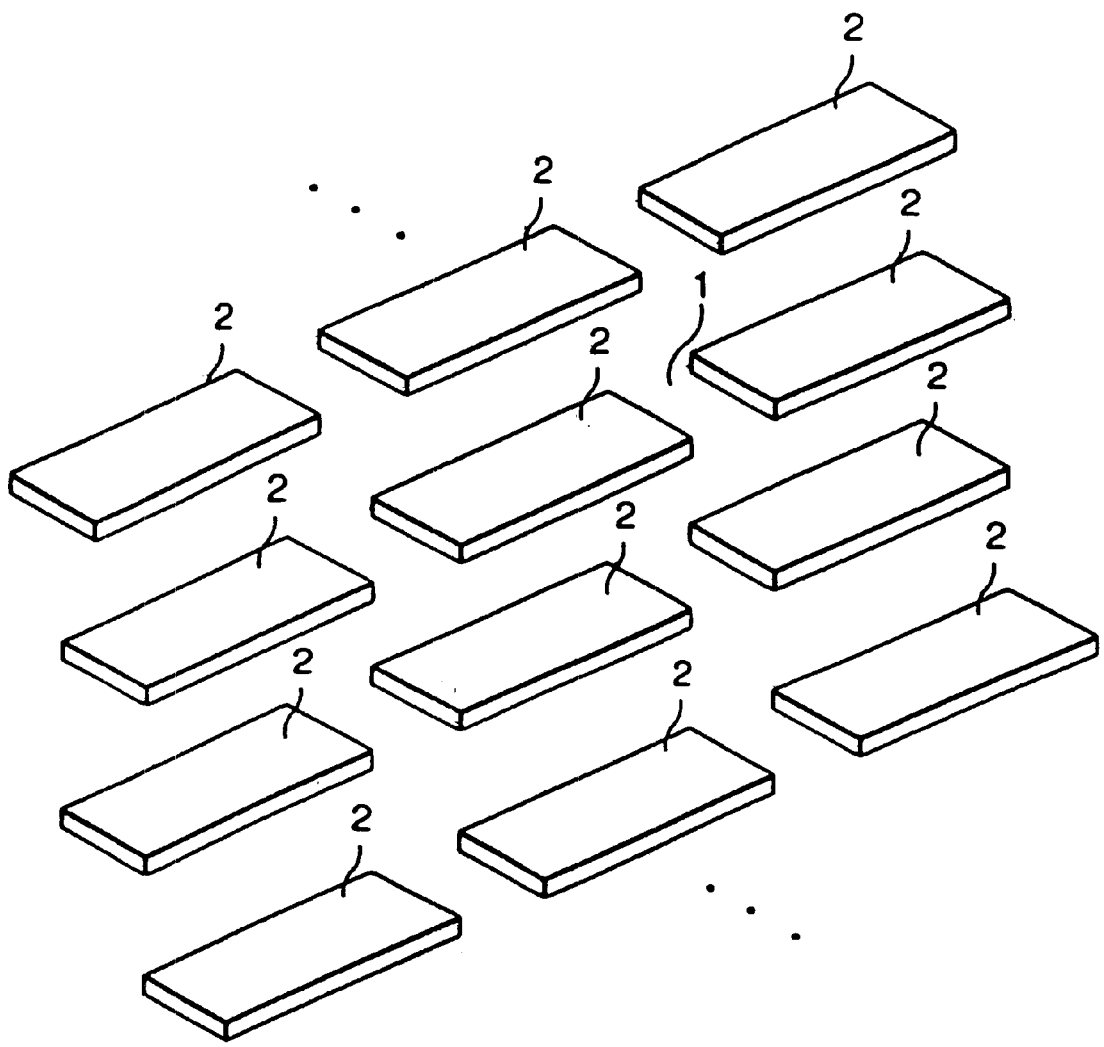
FIG. 1 is a perspective view illustrating the upper surface of a semiconductor substrate on which active regions are formed.
Figure 2:
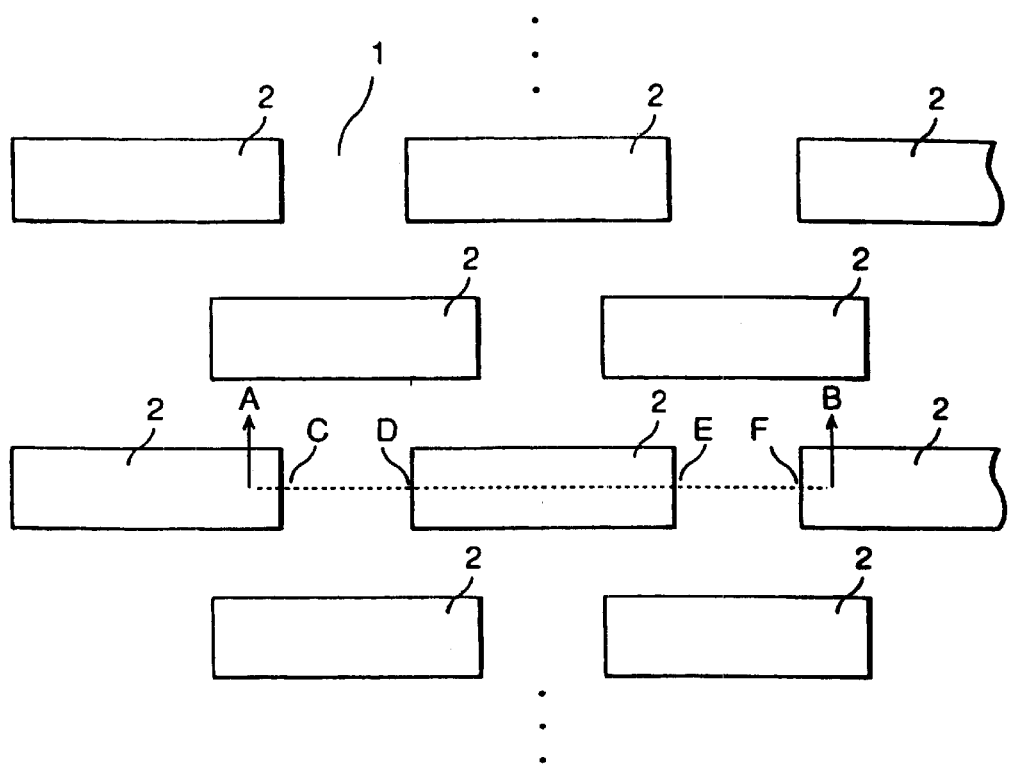
FIG. 2 is a plan view illustrating the upper surface of the semiconductor substrate on which the active regions are formed.
Figure 3:
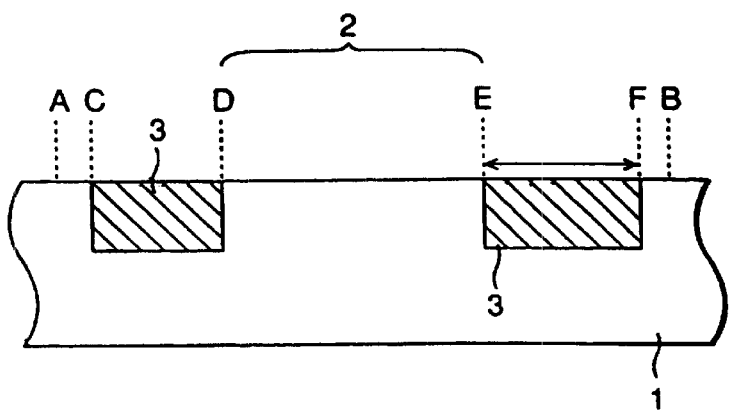
FIG. 3 is a cross sectional view illustrating a part of the semiconductor substrate of FIG. 2.
Figure 4:
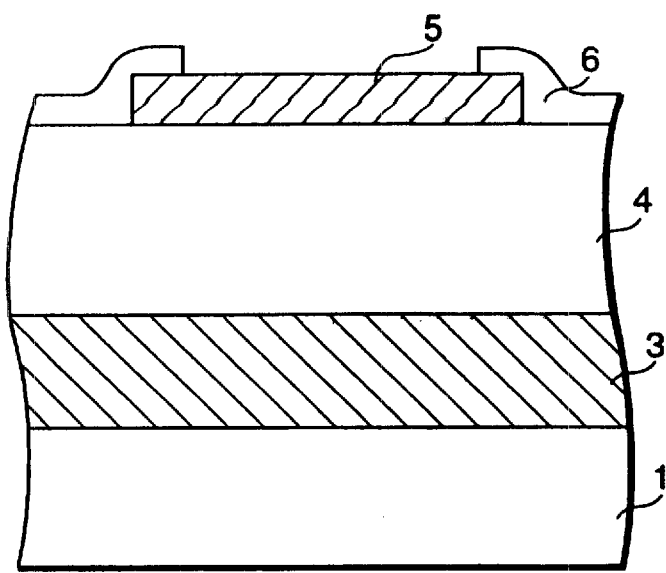
FIG. 4 is a cross sectional view illustrating underlayer portions underlying a pad electrode of a conventional semiconductor device.
Figure 5:
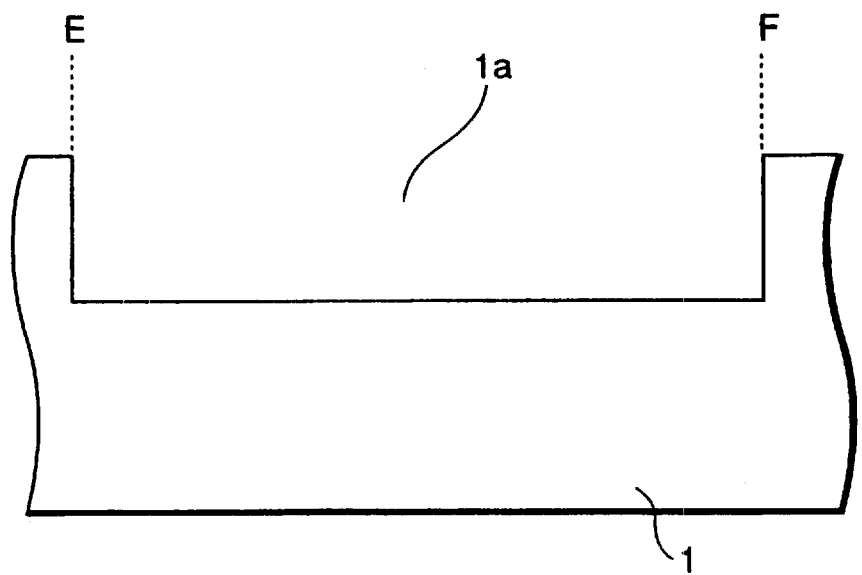
FIG. 5 is a cross sectional view explaining the steps of manufacturing the underlayer portions underlying the pad electrode of the conventional semiconductor device.
Figure 6:
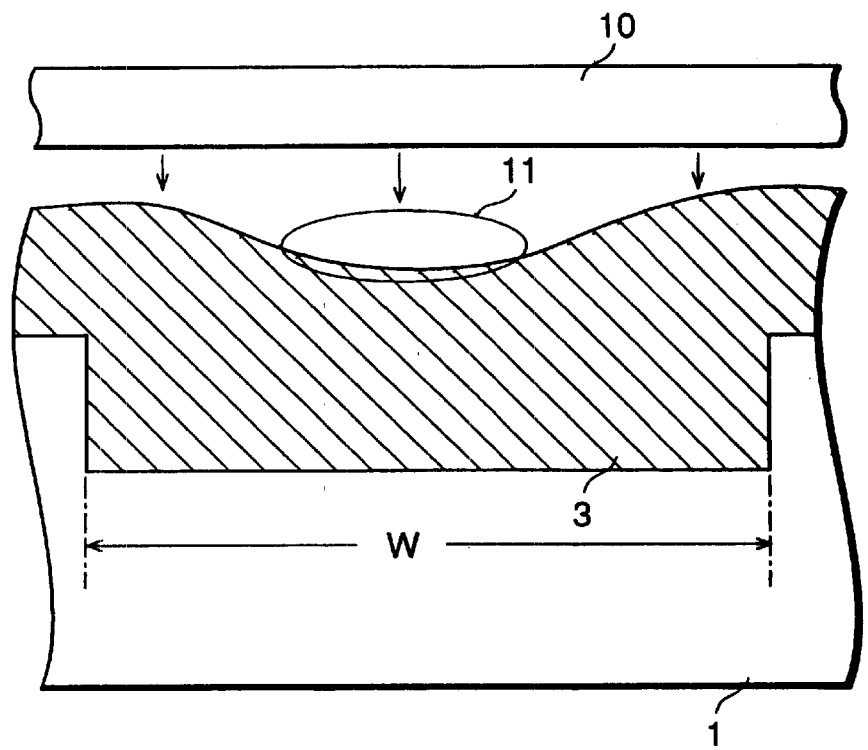
FIG. 6 is a cross sectional view explaining the steps of manufacturing the underlayer portions underlying the pad electrode of the conventional semiconductor device.
Figure 7:
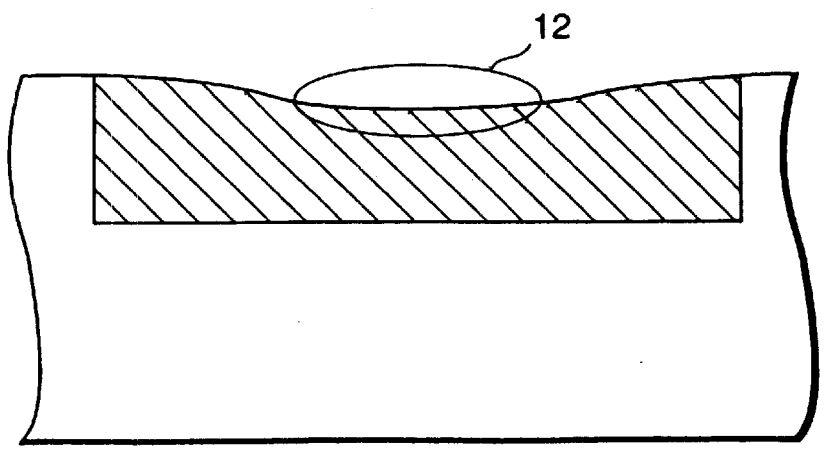
FIG. 7 is a cross sectional view explaining the steps of manufacturing the underlayer portions underlying the pad electrode of the conventional semiconductor device.
Figure 8:
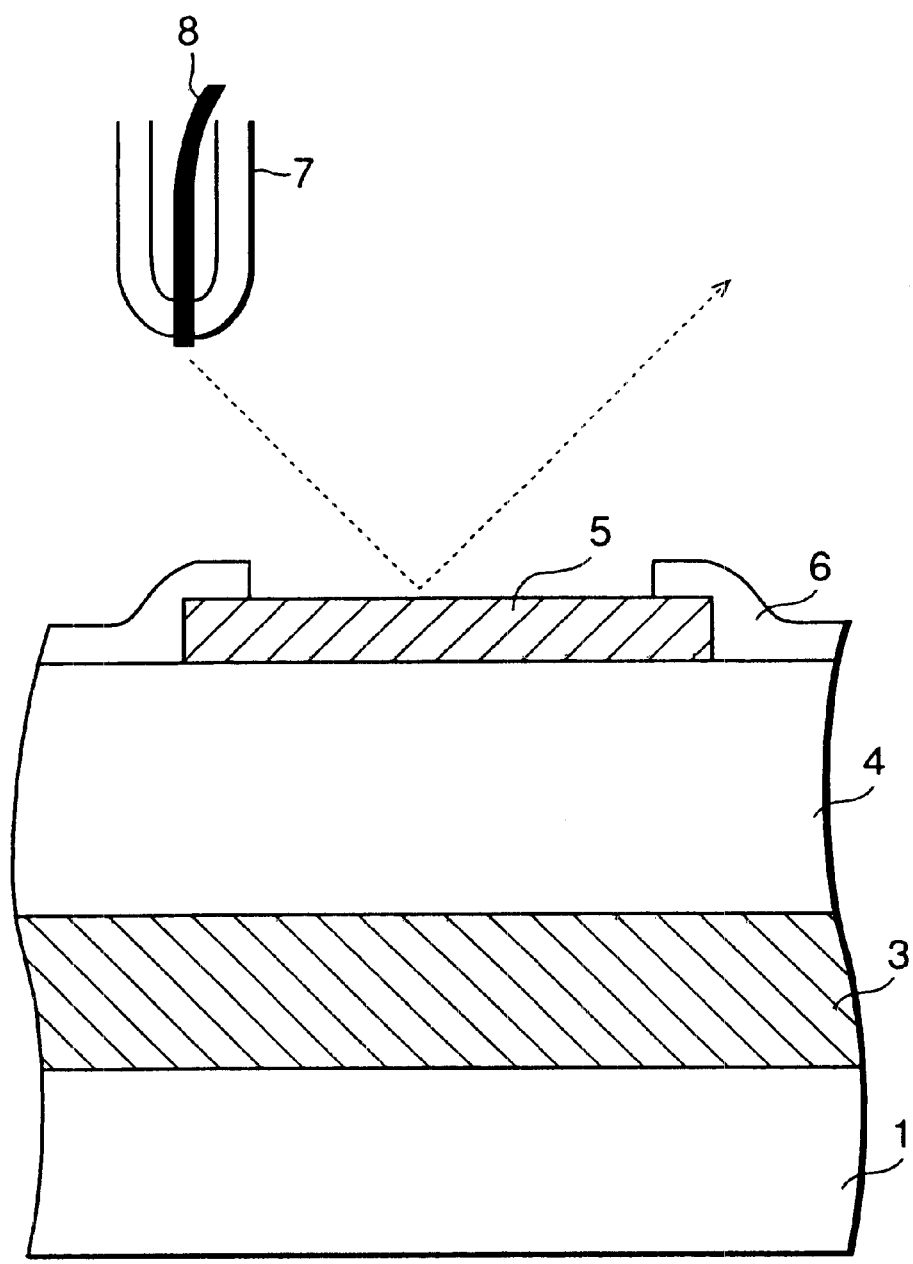
FIG. 8 is a cross sectional view explaining the steps of manufacturing the underlayer portions underlying the pad electrode of the conventional semiconductor device.

Then, the steps shown in FIG. 8 are carried out with respect to the pad electrode 39, so that a wire for electrically connecting the pad electrode 39 to an external device is connected thereto by bonding. This state is not shown. At this time, the bonding damage is applied to the semiconductor substrate 21. However, since the semiconductor substrate 21 is provided with the dummy pattern 30 and the protective film 36 as shown in FIG. 16E, it is possible to decrease the impact applied to the bed region 27. underlying the pad electrode 39 to prevent cracks or the like from occurring.

While the dummy pattern 30 has been formed by the projecting portions 32 forming the simple lattice-shaped pattern in the aforementioned third preferred embodiment, the present invention should not be limited thereto, but any dummy patterns may be used if the patterns have simple designs and if no recessed portions are formed in the bed region underlying the pad electrode.

Figure 17:
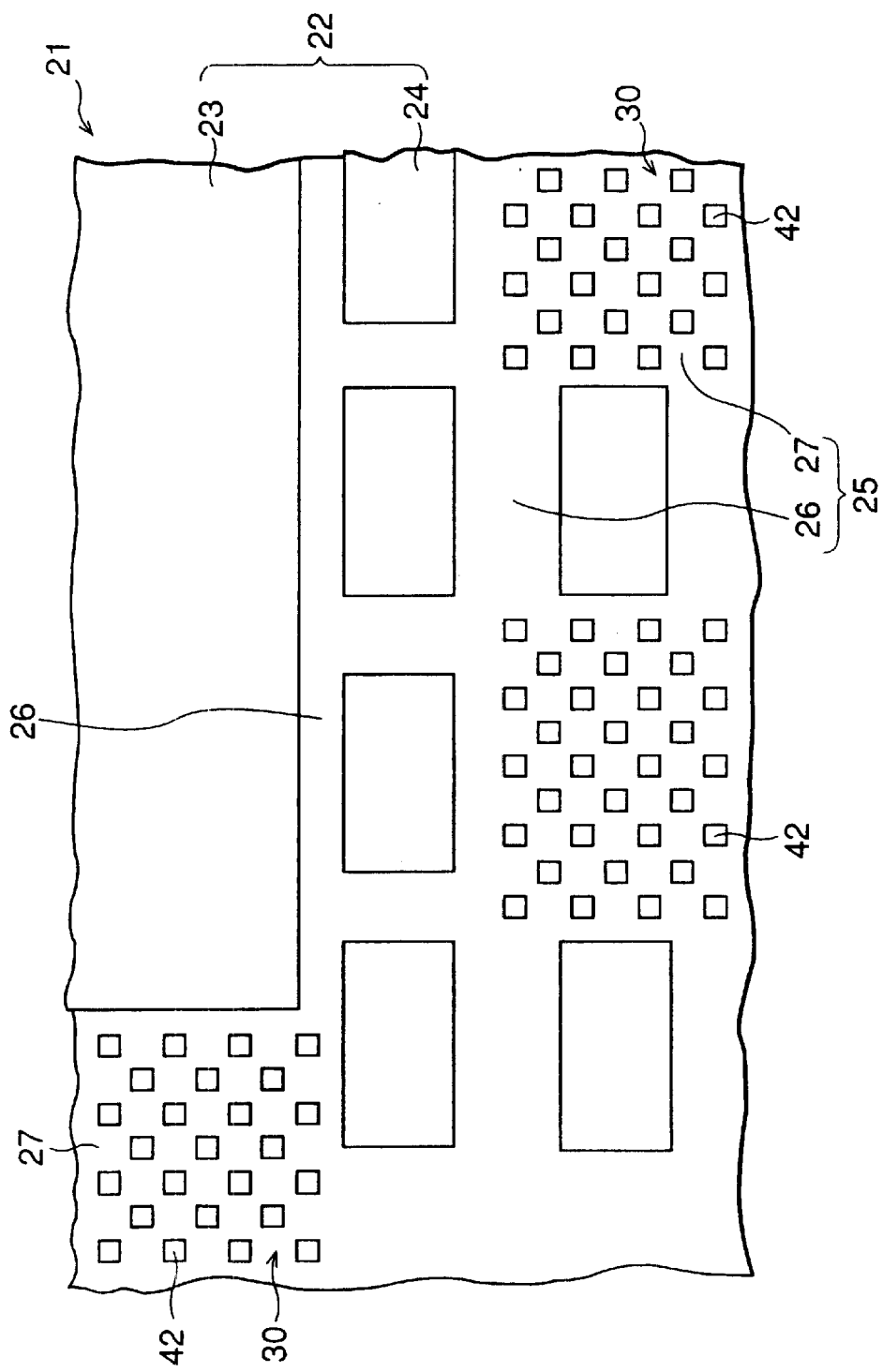
FIG. 17 is a plan view of the fourth preferred embodiment of a semiconductor device according to the present invention.

For example, as the fourth preferred embodiment of a semiconductor device shown in FIG. 17, a plurality of projecting portions 42 may be formed so that one projecting portion is removed with respect to each line adjacent to the bed region 27 of the semiconductor substrate 21. Even in the case of the dummy pattern 30 having such an arrangement, the bed region 27 underlying the pad electrode is provided with the projecting portions 42 having the same level as that of the substrate 21, so that it is possible to effectively decrease and absorb bonding damage.

Moreover, while all the dummy patterns 30 have been formed in the bed regions 27 underlying the pad electrode of the semiconductor substrate 21 in the aforementioned preferred embodiments, the present invention should not be limited thereto, but dummy patterns may be formed in the whole surface of the semiconductor substrate 21 since the dummy patterns are formed at the same time that the pattern of the semiconductor element regions is drafted.

Figure 18:
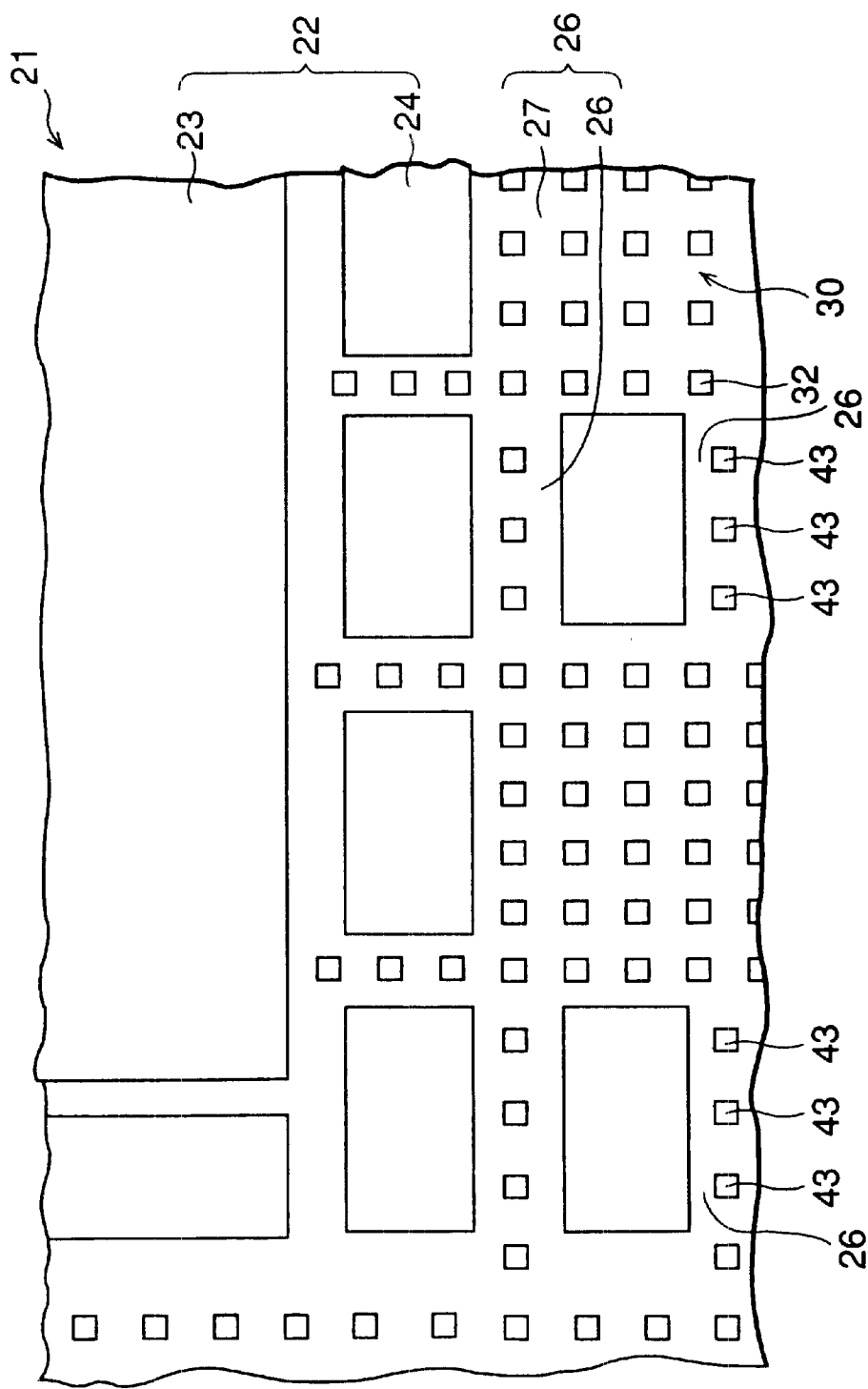
FIG. 18 is a plan view of the fifth preferred embodiment of a semiconductor device according to the present invention.

As an example thereof, FIG. 18 shows the fifth preferred embodiment of a semiconductor device according to the present invention. In FIG. 18, in addition to a plurality of projecting portions 32 forming a lattice-shaped dummy pattern 30, a plurality of projecting portions 43 are also formed in an element isolating region 26 in which an element isolating insulator film is formed. At this point, this preferred embodiment is different from the aforementioned preferred embodiments. With this construction, this preferred embodiment has a peculiar advantageous effect that it is possible to decrease the occurrence of the recessed portion which may occur when an insulator film is formed in the element isolating region 26.

While the dummy pattern 30 has been formed by arranging rectangular projecting portions 32, 42 or 43 so that the pattern is a predetermined pattern in all the aforementioned preferred embodiments, the present invention should not be limited thereto, but the projecting portions may have another geometry such as a circular, elliptic or triangular shape.

Figure 19:
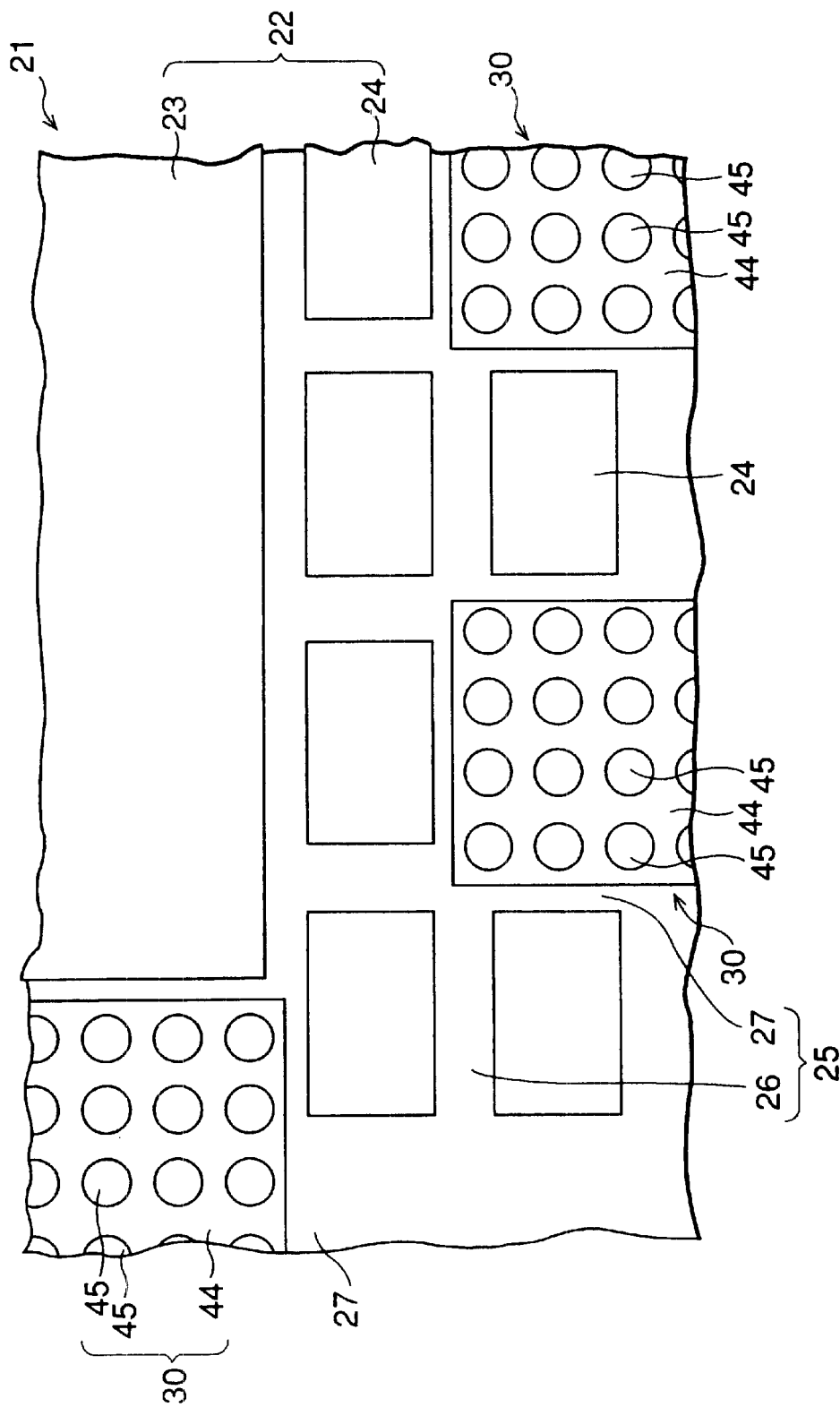
FIG. 19 is a plan view of the sixth preferred embodiment of a semiconductor device according to the present invention.
Figure 20:
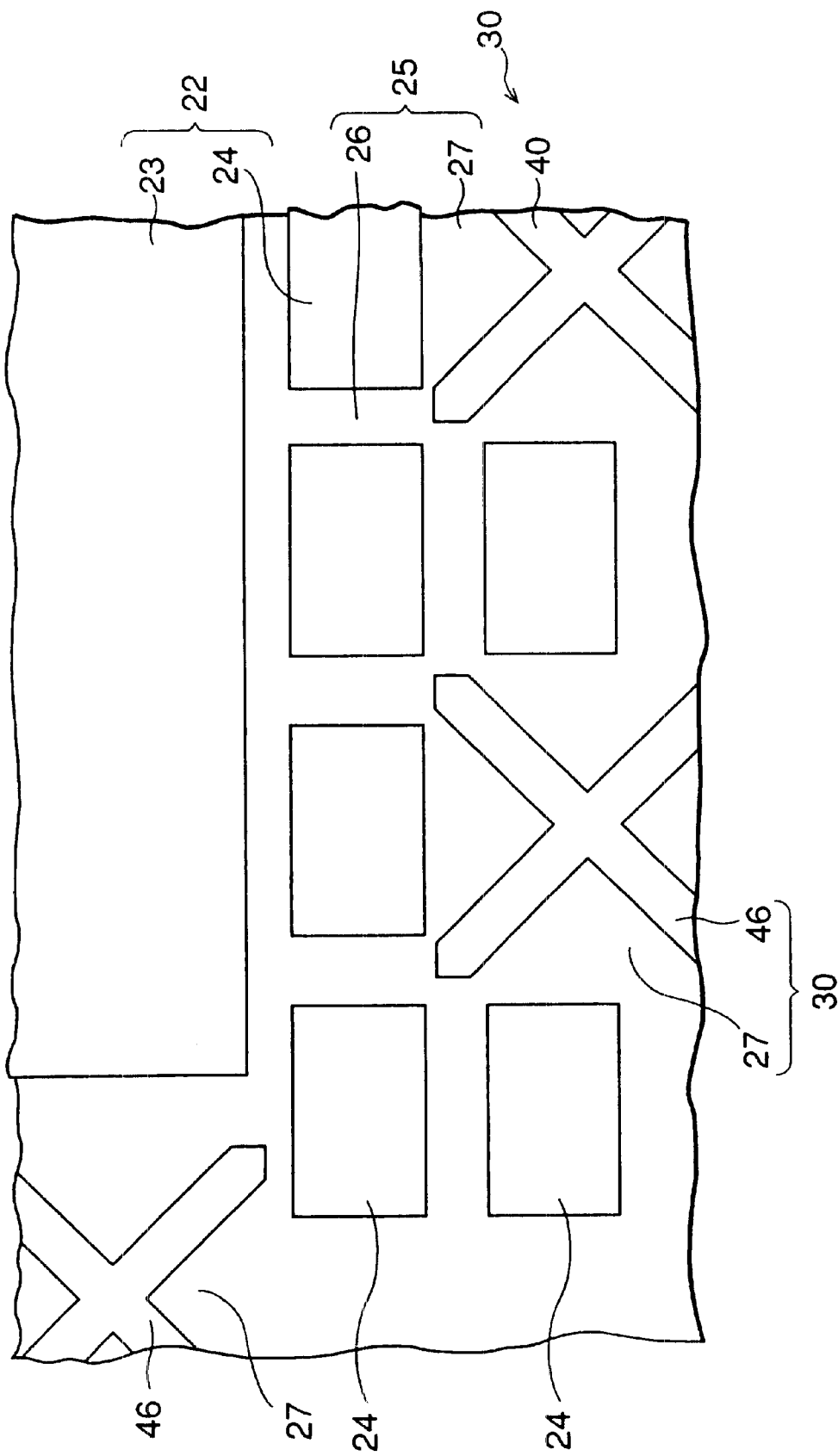
FIG. 20 is a plan view of the seventh preferred embodiment of a semiconductor device according to the present invention.

As an example thereof, FIG. 19 shows the sixth preferred embodiment of a semiconductor device according to the present invention. In FIG. 19, rectangular projecting portions 44 are formed in a bed region 27 for mounting a pad electrode thereon, while leaving isolating grooves similar to other element regions 23 and 24. The projecting portion 44 has predetermined numbers of circular holes 45 which are arranged so as to extend in longitudinal and lateral directions. The depth of the hole 45 is the same as that of the element isolating groove. After an insulating layer is formed in the subsequent step, the shape of cross section thereof is substantially the same as that of FIG. 16. According to the present invention, since it is sufficient to form the dummy pattern 30 at least in the bed region 27, there is no problem even if the arrangement of the projecting and recessed portions of the pattern as the semiconductor device in the sixth preferred embodiment is opposite to those of the semiconductor devices in the first though fifth preferred embodiments.

While the dummy pattern has been formed so as to have a simple shape in all the aforementioned preferred embodiments, the present invention should not be limited thereto, but it may have a shape like a support so as to be able to prevent a recessed portion from being formed in the bed region underlying the pad electrode. Specifically, as the seventh preferred embodiment of a semiconductor device shown in FIG. 20, a X-shaped projection portion 46 may be formed in a bed region 27 in which pad electrodes are formed, so that a dummy pattern 30 is formed by the projection portion 46 and the bed region 27. With this construction, this preferred embodiment has peculiar advantageous effects that it is possible to reinforce the substantially center of the bed region, at which the recessed of the insulator film may most deeply press down and to which force is most concentrically applied when carrying out the wire bonding, to prevent the formation pf a recessed portion of the insulator film, and that it is also possible to effectively support the protective coat from the bottom.

As mentioned above, according to all the preferred embodiments of the present invention, it is possible to prevent a recessed portion from being produced in the insulator film at the bed portion underlying the pad electrode, and it is also possible to sufficiently reinforce the bed region when carrying out the wire bonding, so that it is possible to prevent the occurrence of cracks which reach the semiconductor substrate.

What is claimed is:

1. A semiconductor device comprising:
   a semiconductor substrate having a surface, at least a portion of which being substantially flat, and a predetermined pattern in which an insulating layer is embedded;
   an interlayer insulator film formed above the semiconductor substrate, and the interlayer insulator film having a protective layer for protecting the semiconductor substrate; and
   a pad formed above the interlayer insulator film and to which a damaging force due to wire bonding is applied,
   wherein said predetermined pattern comprises a plurality of projecting portions formed in a non-element region which is not an element forming region, and an element isolating groove configured to divide the projecting portions from the element forming region, and
   wherein said projecting portions form a lattice-shaped pattern, and a plurality of fine grooves exceed in longitudinal and lateral directions.

2. The semiconductor device according to claim 1, wherein said lattice-shaped pattern includes a plurality of small squares, and said plurality of fine grooves include a plurality of narrow grooves which are incised in said projecting portions in longitudinal and lateral directions.

3. The semiconductor device according to claim 2, wherein said plurality of small squares are arranged in longitudinal and lateral directions within a matrix shape.

4. The semiconductor device according to claim 2, wherein the plurality of small squares are further arranged in the element isolating grooves which are provided between two adjacent element forming regions.

5. The semiconductor device according to claim 2, wherein the plurality of small squares are arranged so as to form a checkered pattern.

6. The semiconductor device according to claim 5, wherein a position of each small square in an even number sequence corresponds to a pore space of two adjacent small squares in an odd sequence.

7. The semiconductor device according to claim 1, wherein the insulating layer includes a protective layer formed of nitride.

8. A semiconductor device comprising:
   a semiconductor substrate having a surface, at least a portion of which being substantially flat, and a predetermined pattern in which an insulating layer is embedded;
   an interlayer insulator film formed above the semiconductor substrate, the interlayer insulator film having a protective layer for protecting the semiconductor substrate; and
   a pad formed above the interlayer insulator film and to which a damaging force due to wire bonding is applied,
   wherein said predetermined pattern comprises a projecting portion formed in a non-element region which is not an element forming region, and an element isolating groove configured to divide the projecting portion from the element forming region, and
   wherein said projecting portion has rectangular projecting portions which are formed in a bed portion for mounting a pad electrode thereon while leaving isolating grooves similar to other element regions, and predetermined numbers of circular holes which are arranged so as to extend in longitudinal and lateral directions.

9. The semiconductor device according to claim 8, wherein the predetermined numbers of circular holes have a depth which is substantially the same as that of the element isolating groove.

10. The semiconductor device according to claim 8, wherein the insulating layer includes a protective layer formed of nitride.

11. A semiconductor device comprising:
    a semiconductor substrate having a surface, at least a portion of which being substantially flat, and a predetermined pattern in which an insulating layer is embedded;
    an interlayer insulator film formed above the semiconductor substrate, the interlayer insulator film having a protective layer for protecting the semiconductor substrate;
    a pad formed above the interlayer insulator film and to which a damaging force due to wiring bonding is applied,
    wherein said predetermined pattern comprises a projecting portion formed in a non-element region which is not an element forming region, and an element isolating groove configured to divide the projecting portion from the element forming region, and wherein said projecting portion comprises an X-shaped projection which is arranged to have an X-shape in the entire space surrounded by the element forming regions which are divided by the element isolating grooves, and wherein a cross portion of the X-shaped projection receives the damaging force to the pad.

12. The semiconductor device according to claim 11, wherein said x-shaped projection has a height substantially the same as that of the element forming region.

13. The semiconductor device according to claim 12, wherein each of four portions of said X-shaped projection is isolated by a triangular furrow having the same level as the element isolating groove.

14. The semiconductor device according to claim 11, wherein the insulating layer includes a protective layer formed of nitride.

* * * * *